US012660120B2

(12) United States Patent
Tung et al.

(10) Patent No.: US 12,660,120 B2
(45) Date of Patent: Jun. 16, 2026

(54) COOLING SYSTEM

(71) Applicants:Inventec (Pudong) Technology Corp., Shanghai (CN); Inventec Corporation, Taipei (TW)

(72) Inventors: Kai-Yang Tung, Taipei (TW); Hung-Ju Chen, Taipei (TW); Yin-Po Chiu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 261 days.

(21) Appl. No.: 18/657,743

(22) Filed: May 7, 2024

(65) Prior Publication Data

US 2025/0280507 A1 Sep. 4, 2025

(30) Foreign Application Priority Data

Feb. 29, 2024 (CN) .......................... 202410232383.9

(51) Int. Cl.
H05K 7/20 (2006.01)

(52) U.S. Cl.
CPC ..... H05K 7/20245 (2013.01); H05K 7/20254 (2013.01); H05K 7/20809 (2013.01)

(58) Field of Classification Search
CPC .......... H05K 7/20309; H05K 7/20318; H05K 7/20336; H05K 7/20809; H05K 7/20245
See application file for complete search history.

(56) References Cited

U.S. PATENT DOCUMENTS

| 9,552,025 B2 * | 1/2017 | Samadiani | ................ G06F 1/20 |
| 9,713,291 B1 * | 7/2017 | Rice | ........................... G06F 1/20 |
| 10,352,624 B1 * | 7/2019 | Rice | ................... F28D 15/0275 |
| 12,538,453 B2 * | 1/2026 | Lin | ................... H05K 7/20309 |
| 2014/0345829 A1 * | 11/2014 | Kang | ...................... F25B 39/04 |
| | | | 165/104.21 |

FOREIGN PATENT DOCUMENTS

| TW | 202402146 A | * | 1/2024 |
| TW | 202402147 A | * | 1/2024 |

* cited by examiner

*Primary Examiner* — Zachary Pape
(74) *Attorney, Agent, or Firm* — Winston Hsu

(57) ABSTRACT

A cooling system includes a first liquid cooling plate, a second liquid cooling plate, a communication structure, a first thermosiphon device, and a second thermosiphon device. The communication structure is disposed between the first liquid cooling plate and the second liquid cooling plate, and connects flow channels in the first liquid cooling plate and the second liquid cooling plate. The first thermosiphon device and the second thermosiphon device are both thermally coupled to the first liquid cooling plate and the second liquid cooling plate. The first thermosiphon device and the second thermosiphon device are located on opposite sides of the communication structure and between the first liquid cooling plate and the second liquid cooling plate.

10 Claims, 8 Drawing Sheets

COOLING SYSTEM

BACKGROUND OF THE INVENTION

1. Field of the Invention

The present invention relates to a cooling system, and more particularly to a cooling system utilizing thermosiphon.

2. Description of the Prior Art

For a 1 U water-cooled thermosiphon, the goals of low leakage hazard and high heat dissipation capability are achieved by combining the thermosiphon with a water cooling plate. In addition, the fins on the bottom of the water cooling plate can be used to cool the outlet airflow of the server, thereby reducing the load of the computer room air conditioner and improving cooling efficiency. However, the height difference between the evaporator and the condenser in the 1 U space is limited. A smaller height difference will reduce the return capacity of the cooled water. In order to increase the height difference between the two as much as possible, the condenser can only be set at the highest position of the system. This configuration causes the condenser to be in contact with the water cooling plate only through its lower surface, causing uneven temperature of the condenser, reducing the capability of the thermosiphon to transfer heat to the water cooling plate, and limiting the cooling capacity of this cooling module.

SUMMARY OF THE INVENTION

An objective of the invention is to provide a cooling system, which uses two connected liquid cooling plates sandwiching two thermosiphon devices to improve the cooling capacity of the thermosiphon devices to heat sources.

A cooling system of an embodiment according to the invention includes a first liquid cooling plate, a second liquid cooling plate, a communication structure, a first thermosiphon device, and a second thermosiphon device. The first liquid cooling plate has a first left side flow channel, a first right side flow channel, a first inlet, and a first outlet. The first left side flow channel is connected to the first inlet and the first outlet. The first right side flow channel is connected to the first inlet and the first outlet. The second liquid cooling plate has a second left side flow channel, a second right side flow channel, a second inlet, and a second outlet. The second left side flow channel is connected to the second inlet and the second outlet. The second right side flow channel is connected to the second inlet and the second outlet. The communication structure is disposed between the first liquid cooling plate and the second liquid cooling plate and connects the first outlet and the second inlet. The first thermosiphon device is located between the first left side flow channel and the second left side flow channel and is thermally coupled to the first liquid cooling plate and the second liquid cooling plate. The second thermosiphon device is located between the first right side flow channel and the second right side flow channel and is thermally coupled to the first liquid cooling plate and the second liquid cooling plate. The first thermosiphon device and the second thermosiphon device are located on opposite sides of the communication structure. Thereby, compared with the configuration in the prior art that only one side of the condenser exchanges heat with the liquid cooling plate, both sides of the first and second thermosiphon devices (or the condensers thereof) can exchange heat with the first and second liquid cooling plates, so that the cooling capacity to the heat sources can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
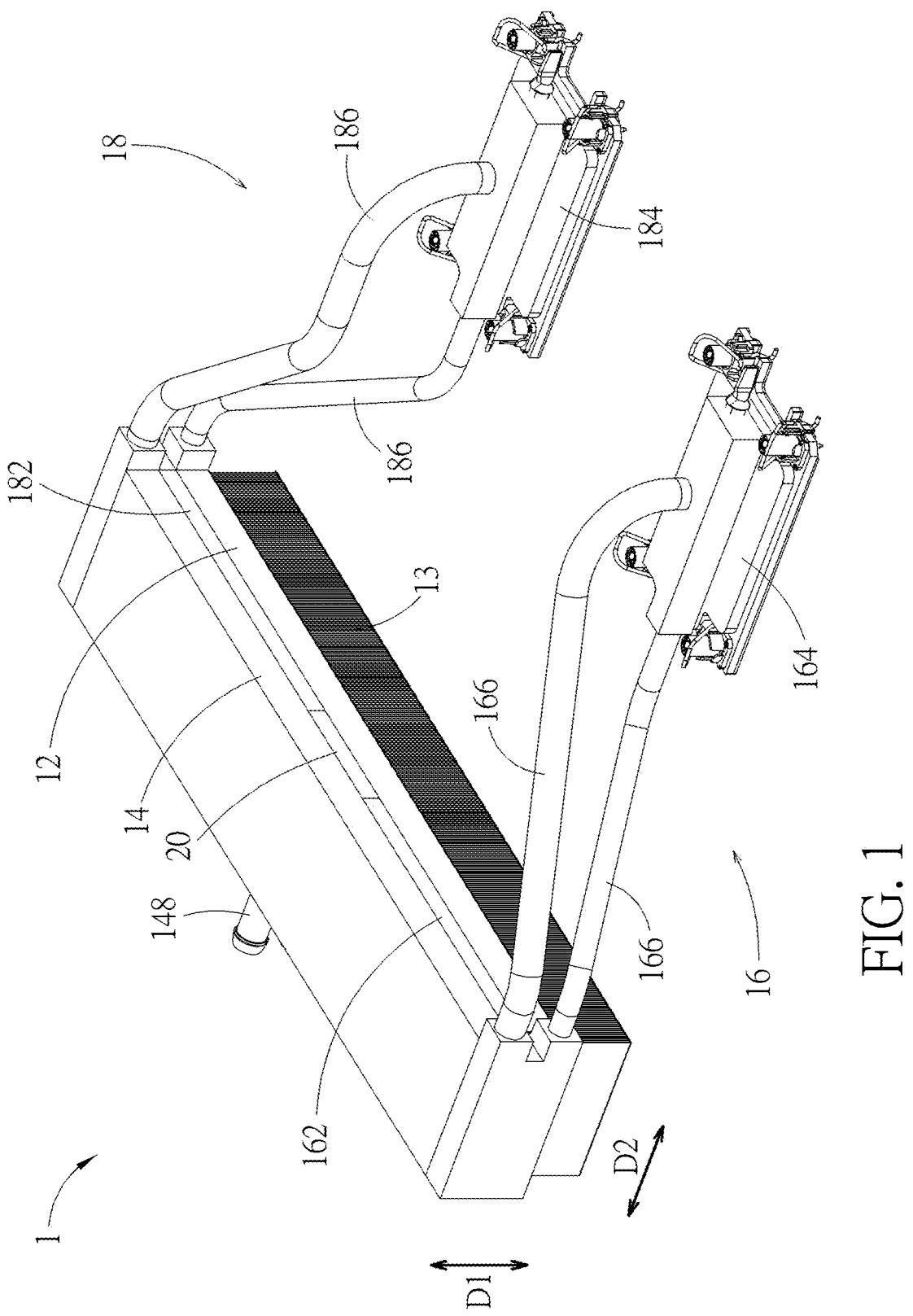
FIG. 1 is a schematic diagram illustrating a cooling system according to an embodiment.
Figure 2:
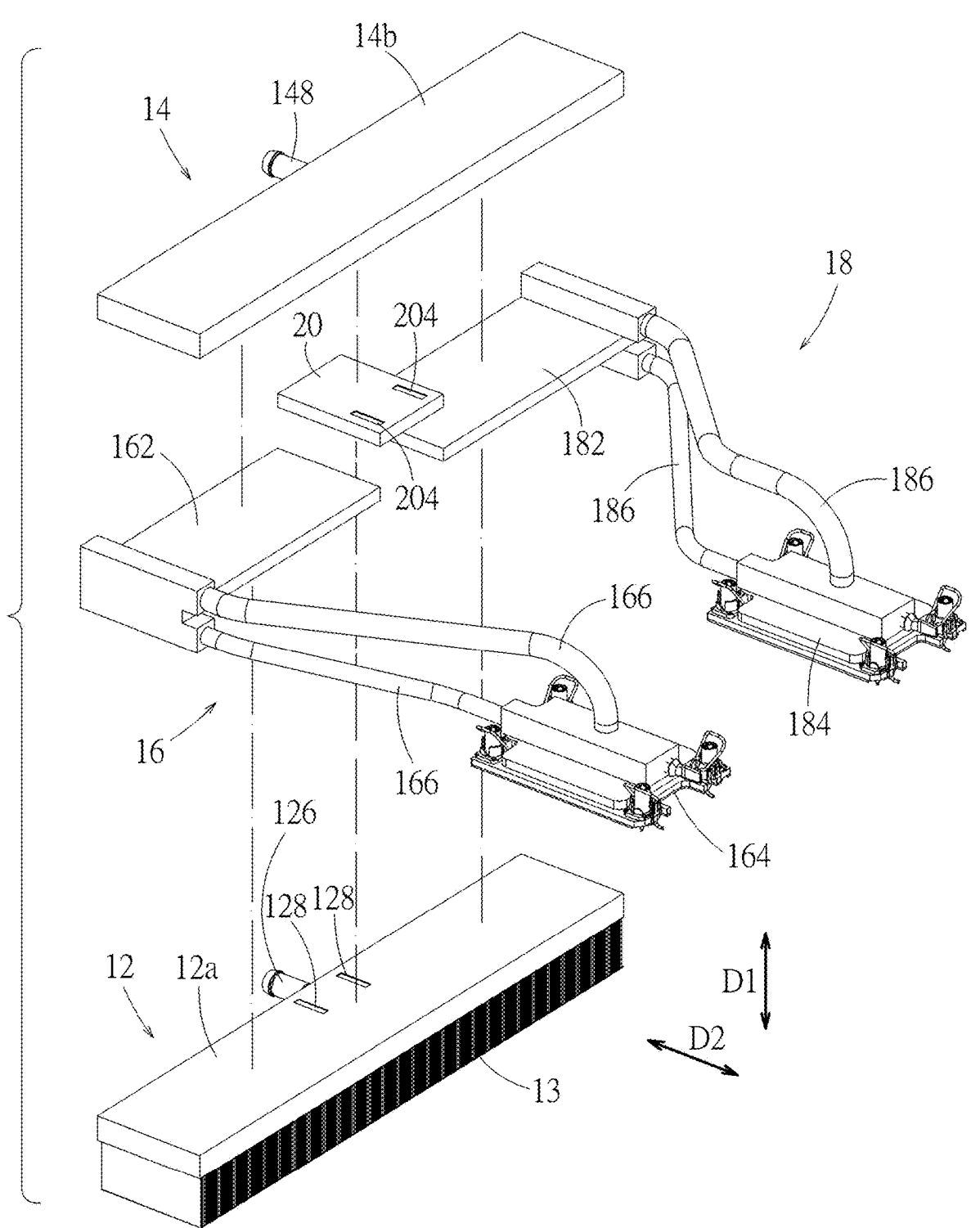
FIG. 2 is a partially-exploded view of the cooling system in FIG. 1.
Figure 3:
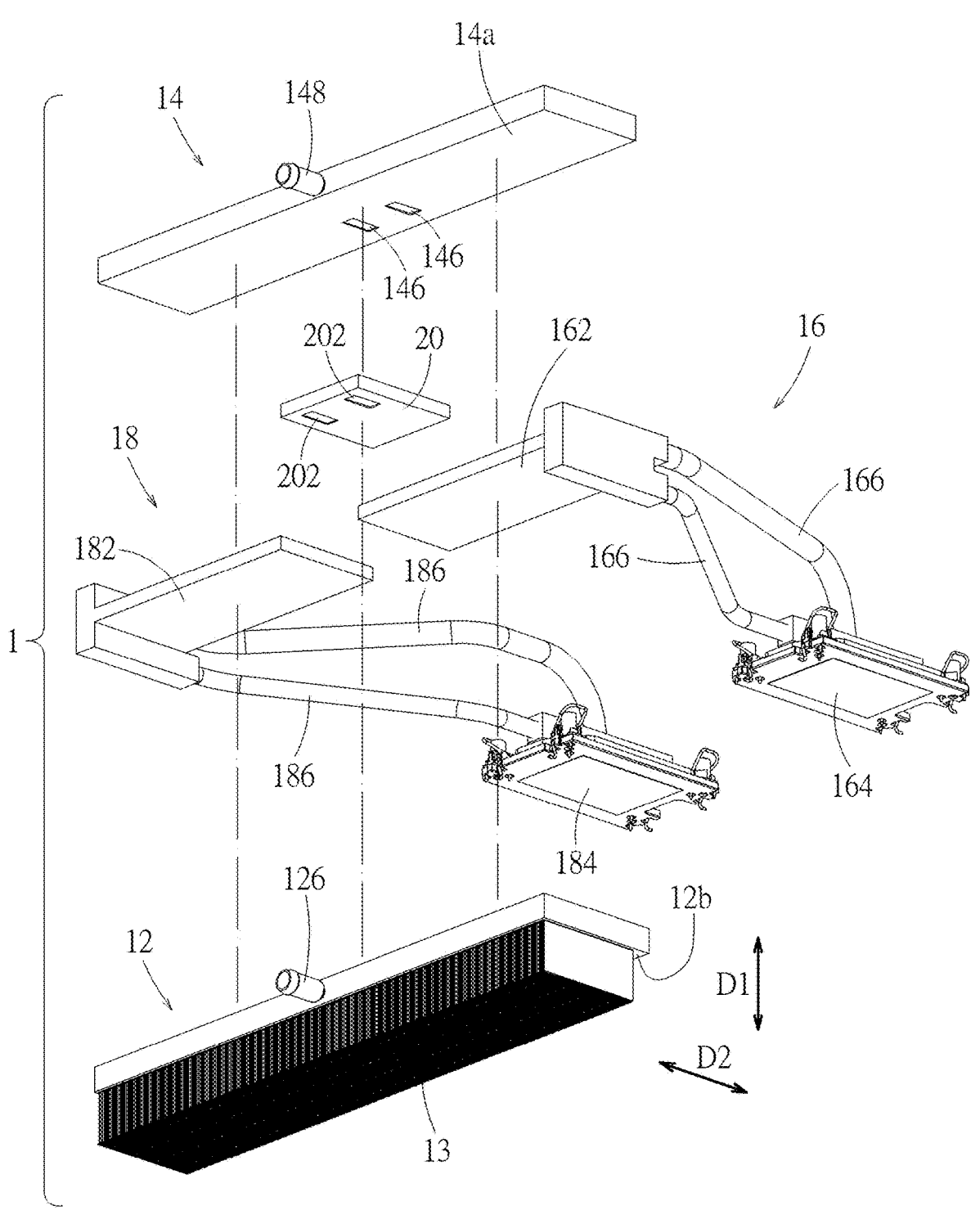
FIG. 3 is another partially-exploded view of the cooling system in FIG. 1.

Please refer to FIG. 1 to FIG. 3. A cooling system 1 according to an embodiment includes a first liquid cooling plate 12, a second liquid cooling plate 14, a first thermosiphon device 16, and a second thermosiphon device 18, and a communication structure 20. The first liquid cooling plate 12 and the second liquid cooling plate 14 are spaced apart and opposite to each other in a first direction D1 (indicated by a double-headed arrow in the figures). Their working fluid flow channels communicate through the communication structure 20. A surface 12a of the first liquid cooling plate 12 is opposite to a surface 14a of the second liquid cooling plate 14. The first thermosiphon device 16 and the second thermosiphon device 18 are sandwiched by the first liquid cooling plate 12 (or the surface 12a thereof) and the second liquid cooling plate 14 (or the surface 14a thereof), and are located on opposite sides of the communication structure. Thereby, each of the first thermosiphon device 16 and the second thermosiphon device 18 is directly thermally coupled to the first liquid cooling plate 12 (or the surface 12a thereof) and the second liquid cooling plate 14 (or the surface 14a thereof). Through heat exchange between the first thermosiphon device 16 and the second thermosiphon device 18 with the first liquid cooling plate 12 and the second liquid cooling plate 14, the first liquid cooling plate 12 and the second liquid cooling plate 14 can absorb heat from the first thermosiphon device 16 and the second thermosiphon device 18, thereby achieving the heat dissipation effect. Furthermore, in the embodiment, the communication structure 20 is located inside the first liquid cooling plate 12 and the second liquid cooling plate 14; that is, in the first direction D1, the projection of the communication structure 20 is located within the projection of the first liquid cooling plate 12 and the second liquid cooling plate 14. This structural configuration helps to reduce protruding structures of the cooling system 1 and avoid structural interference with external structures (e.g., when the cooling system 1 is installed in a server, the expansion cards, air deflectors, electronic components, etc. in the server are regarded as external structures outside the cooling system 1).

Figure 4:
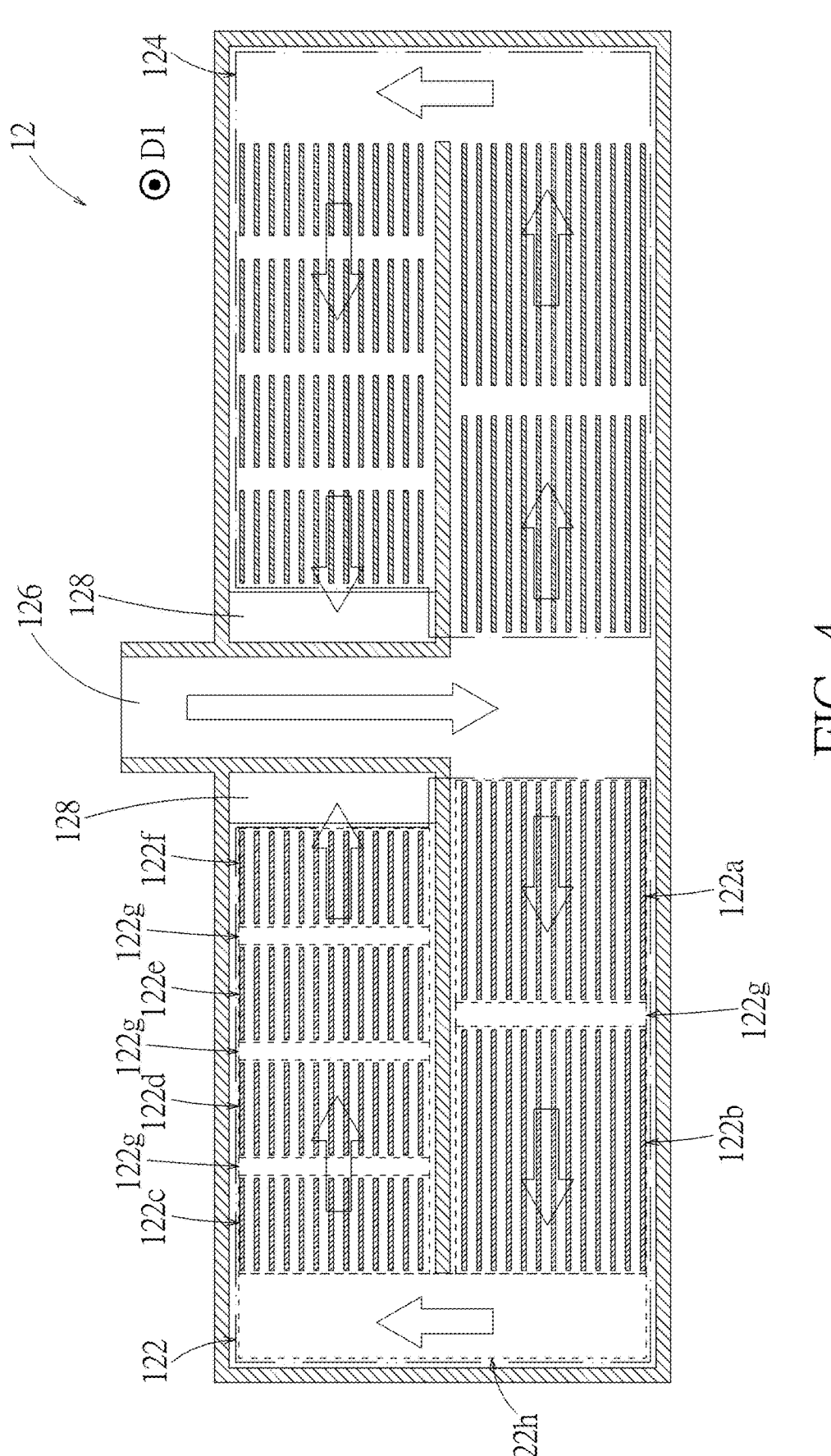
FIG. 4 is a schematic diagram illustrating flow channels inside the first liquid cooling plate of the cooling system in FIG. 1.

Please refer to FIG. 4, which is a schematic diagram illustrating flow channels inside the first liquid cooling plate 12; the flow channels are shown in cross section. The first liquid cooling plate 12 has a first left side flow channel 122 (whose extent is shown by a frame in chain lines in the figure), a first right side flow channel 124 (whose extent is shown by a frame in chain lines in the figure), a first inlet 126, and a first outlet 128. The first inlet 126 is structurally a channel. The first outlet 128 structurally includes two channels (corresponding to the first left side flow channel 122 and the first right side flow channel 124). In structural logic, the first inlet 126 is connected to one end of the first left side flow channel 122 and one end of the first right side flow channel 124 at the same time; the first outlet 128 is connected to the other end of the first left side flow channel 122 and the other end of the first right side flow channel 124 at the same time. In other words, the first left side flow channel 122 and the first right side flow channel 124 are connected in parallel to form a first parallel flow channel; each of the first inlet 126 and the first outlet 128 is connected to both ends of the first parallel flow channel. In practical applications, the working fluid will flow into the first liquid cooling plate 12 from the first inlet 126, and flow separately through the first left side flow channel 122 and the first right side flow channel 124, and finally flow out of the first liquid cooling plate 12 from the first outlet 128. Therein, the flow direction of the working fluid in the first liquid cooling plate 12 is indicated by hollow arrows.

Furthermore, in the embodiment, each of the first left side flow channel 122 and the first right side flow channel 124 is a U-shaped flow channel and they are symmetrical in structure. Taking the first left side flow channel 122 as an example, the first left side flow channel 122 includes a first section 122a, a second section 122b, a third section 122c, a fourth section 122d, a fifth section 122e, and a sixth section 122f (whose extents are shown by frames in dashed lines in the figure) in the order of the flow direction. The flow resistance between two adjacent sections (e.g., between the first section 122a and the second section 122b, between the third section 122c and the fourth section 122d, and etc.) is less than the flow resistance of the two sections. This can be achieved by designing the cross-sectional size, shape, flow channel wall type, etc. of the first left side flow channel 122 at each section. This difference in flow resistance helps the working fluid mix between the sections, increases the uniformity of the temperature of the working fluid, and avoiding the generation of local hot spots.

In the embodiment, the first left side flow channel 122 includes five cavity sections 122g and 122h (whose extents are shown by frames in dashed lines in the figure). There is one cavity section 122g between the first section 122a and second section 122b. There is another cavity section 122g between any two sections of the third to sixth sections 122c~122f. There is one cavity section 122h between the second section 122b and third section 122c. There are fins in each of the first to sixth sections 122a~122f, while no fin is provided in the cavity sections 122g and 122h. This fin configuration can make the flow resistance of the first left side flow channel 122 in the cavity sections 122g and 122h less than the flow resistance of the first left side flow channel 122 in each of the first to sixth sections 122a~122f. The fins in the first left side flow channel 122 can increase the heat exchange efficiency.

Furthermore, the above descriptions about the first left side flow channel 122 also apply to the first right side flow channel 124, and will not be repeated in addition. Furthermore, although the above descriptions of the first liquid cooling plate 12 take the structural symmetry of the first left side flow channel 122 and the first right side flow channel 124 as an example, the implementation is not limited thereto. In addition, as shown by FIG. 1 to FIG. 4, in the embodiment, there are a plurality of fins 13 which are disposed on a surface 12b of the first liquid cooling plate 12 (opposite to the surface 12a) and extend in a second direction D2 (indicated by a double-headed arrow in the figures). The fins 13 can also exchange heat with the surrounding environment of the first liquid cooling plate 12. For example, when the cooling system 1 is installed in an equipment chassis, the chassis configuration can be designed so that the cooling airflow in the chassis (e.g., generated by fans) can flow through these fins 13 (e.g., the flow direction of the cooling airflow flowing here is roughly parallel to the second direction D2). Thereby, the first liquid cooling plate 12 can also cool the cooling airflow through these fins 13, which can reduce the cooling load inside the chassis (e.g., reducing the operating power of the cooling fans), also reduce the cooling load outside the chassis (e.g., the operating power of the cooling fans in the cabinet accommodating multiple devices), and also help to reduce the air conditioning load of the computer room (accommodating the above equipment or cabinet).

Figure 5:
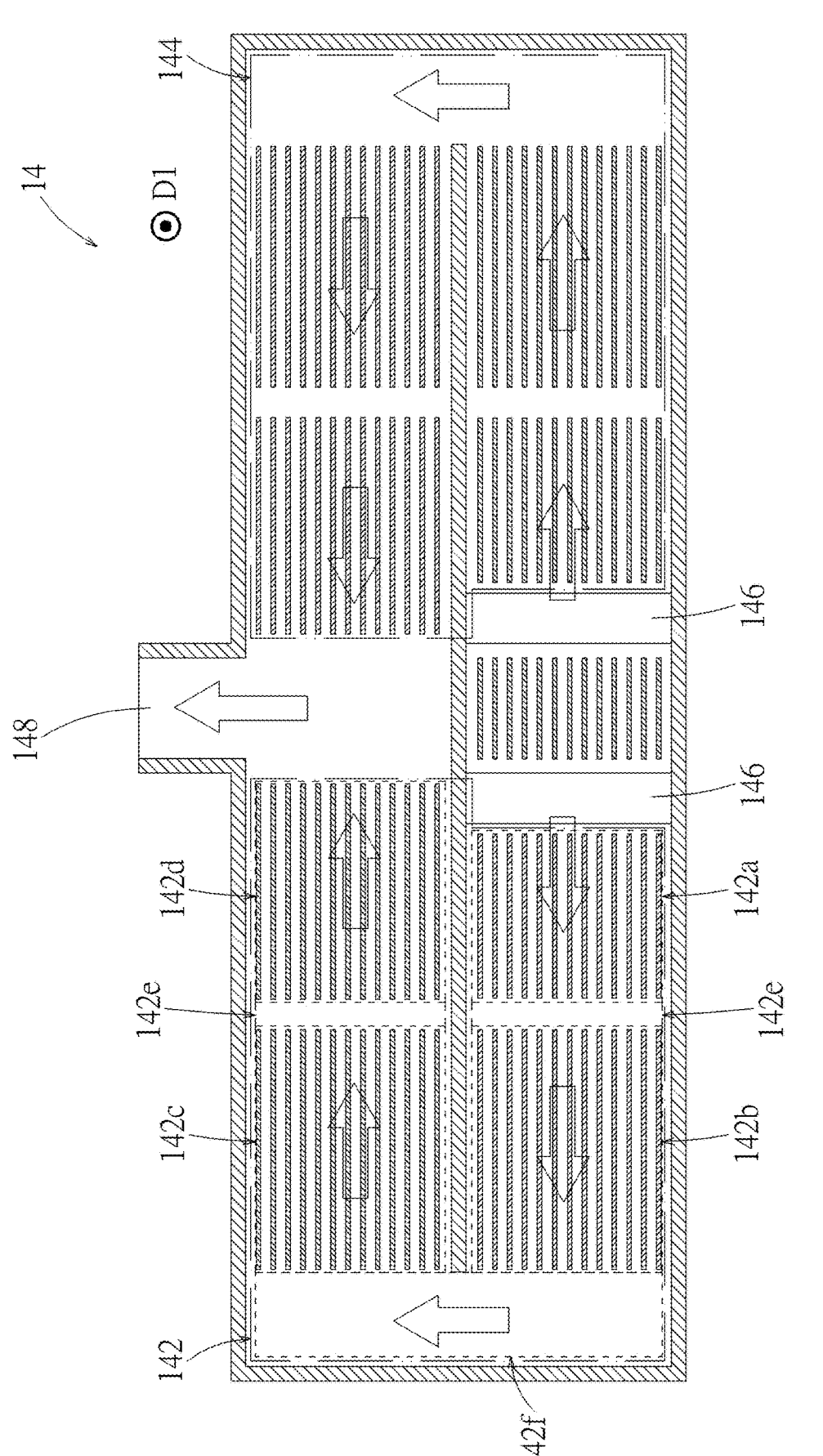
FIG. 5 is a schematic diagram illustrating flow channels inside the second liquid cooling plate of the cooling system in FIG. 1.

Please refer to FIG. 5, which is a schematic diagram illustrating flow channels inside the second liquid cooling plate 14; the flow channels are shown in cross section. The second liquid cooling plate 14 has a second left side flow channel 142 (whose extent is shown by a frame in chain lines in the figure), a second right side flow channel 144 (whose extent is shown by a frame in chain lines in the figure), a second inlet 146, and a second outlet 148. The second inlet 146 structurally includes two channels (corresponding to the second left side flow channel 142 and the second right side flow channel 144). The second outlet 148 is structurally a channel. In structural logic, the second inlet 146 is connected to one end of the second left side flow channel 142 and one end of the second right side flow channel 144 at the same time; the second outlet 148 is connected to the other end of the second left side flow channel 142 and the other end of the second right side flow channel 144 at the same time. In other words, the second left side flow channel 142 and the second right side flow channel 144 are connected in parallel to form a second parallel flow channel; each of the second inlet 146 and the second outlet 148 is connected to both ends of the second parallel flow channel. In practical applications, the working fluid will flow into the second liquid cooling plate 14 from the second inlet 146, and flow separately through the second left side flow channel 142 and the second right side flow channel 144, and finally flow out of the second liquid cooling plate 14 from the second outlet 148. Therein, the flow direction of the working fluid in the second liquid cooling plate 14 is indicated by hollow arrows.

Furthermore, in the embodiment, each of the second left side flow channel 142 and the second right side flow channel 144 is a U-shaped flow channel and they are symmetrical in structure. Taking the second left side flow channel 142 as an example, the second left side flow channel 142 includes a first section 142*a*, a second section 142*b*, a third section 142*c*, and a fourth section 142*d* (whose extents are shown by frames in dashed lines in the figure) in the order of the flow direction. The flow resistance of the second left side flow channel 142 between the first section 142*a* and the second section 142*b* is less than the flow resistance of the first section 142*a* and the flow resistance of the second section 142*b*. This can be achieved by designing the cross-sectional size, shape, flow channel wall type, etc. of the second left side flow channel 142 at each section. This difference in flow resistance helps the working fluid mix between the sections, increases the uniformity of the temperature of the working fluid, and avoiding the generation of local hot spots.

In the embodiment, the second left side flow channel 142 includes three cavity sections 142*e* and 142*f* (whose extents are shown by frames in dashed lines in the figure). There is one cavity section 142*e* between the first section 142*a* and second section 142*b*. There is another cavity section 142*e* between the third section 142*c* and the fourth section 142*d*. There is one cavity section 142*f* between the second section 142*b* and the third section 142*c*. There are fins in each of the first section 142*a*, the second section 142*b*, the third section 142*c*, and the fourth section 142*d*, while no fin is provided in the cavity sections 142*e* and 142*f*. This fin configuration can make the flow resistance of the second left side flow channel 142 in the cavity sections 142*e* and 142*f* less than the flow resistance of the second left side flow channel 142 in each of the first section 142*a*, the second section 142*b*, the third section 142*c*, and the fourth section 142*d*. The fins in the second left side flow channel 142 can increase the heat exchange efficiency.

Furthermore, the above descriptions about the second left side flow channel 142 also apply to the second right side flow channel 144, and will not be repeated in addition. Furthermore, although the above descriptions of the second liquid cooling plate 14 take the structural symmetry of the second left side flow channel 142 and the second right side flow channel 144 as an example, the implementation is not limited thereto. In addition, in practice, it is practicable to dispose a plurality of fins on a surface 14*b* of the second liquid cooling plate 14 (opposite to the surface 14*a*) to exchange heat with the surrounding environment, thereby producing essentially the same effect as the above fins 13.

Figure 6:
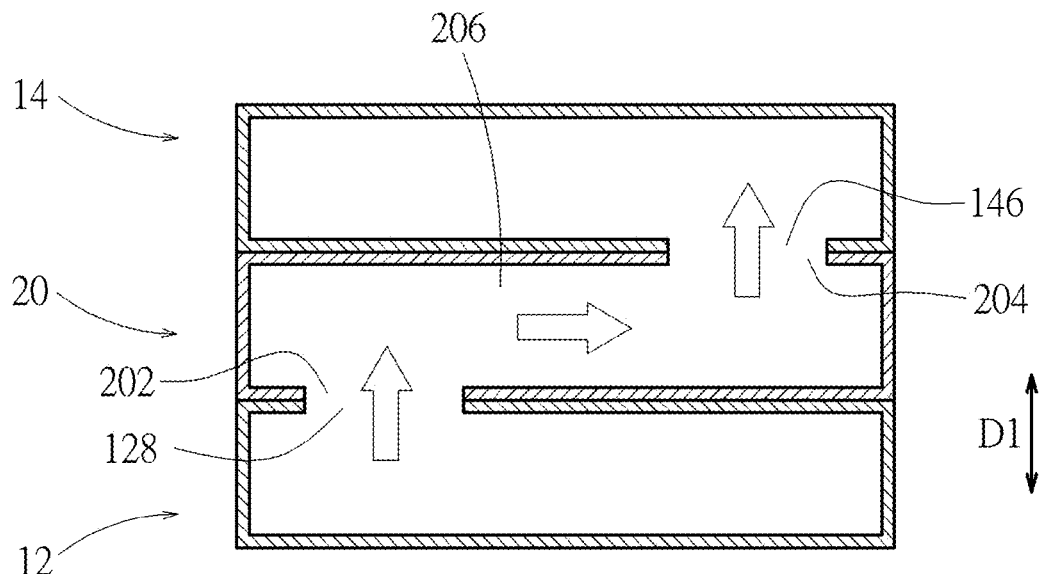
FIG. 6 is a schematic diagram illustrating a communication structure that connects the first liquid cooling plate and the second liquid cooling plate in FIG. 1.

Please refer to FIG. 6, which is a schematic diagram illustrating the communication structure 20 that connects the first liquid cooling plate 12 and the second liquid cooling plate 14. An inlet 202 of the communication structure 20 is connected to the first outlet 128 of the first liquid cooling plate 12. An outlet 204 of the communication structure 20 is connected to the second inlet 146 of the second liquid cooling plate 14. The communication structure 20 has a connecting flow channel 206 which extends parallel to the first liquid cooling plate 12 and the second liquid cooling plate 14. Thereby, after the working fluid enters the communication structure 20 from the inlet 202, the working fluid will flow horizontally in the connecting flow channel 206 of the communication structure 20 (i.e., flowing perpendicular to the first direction D1), and then flow out of the communication structure 20 from the outlet 204.

Furthermore, please refer to FIG. 1, FIG. 4 and FIG. 5. The first outlet 128 of the first liquid cooling plate 12 and the second inlet 146 of the second liquid cooling plate 14 are connected through a communication structure 20, so that the first parallel flow channel of the first liquid cooling plate 12 and the second parallel flow channel of the second liquid cooling plate 14 are connected in series (through the communication structure 20). Thereby, the working fluid will first flow through the first liquid cooling plate 12 and then through the second liquid cooling plate 14. In the embodiment, the first direction D1 is parallel to the direction of gravity. The second liquid cooling plate 14 is located above the first liquid cooling plate 12. Therefore, in principle, the temperature of the working fluid in the second liquid cooling plate 14 will be higher than the temperature of the working fluid in the first liquid cooling plate 12, which helps to avoid or reduce the interference of the temperature gradient of the working fluid on the flow of the working fluid.

Furthermore, as shown by FIG. 1 to FIG. 5, in the embodiment, the first thermosiphon device 16 corresponds to the first left side flow channel 122 and the second left side flow channel 142 and is thermally coupled between the first liquid cooling plate 12 and the second liquid cooling plate 14 (for example, the first thermosiphon device 16 directly contacts the surface 12*a* of the first liquid cooling plate 12 and the surface 14*a* of the second liquid cooling plate 14, and the contact surfaces thereof can be coated with thermal conductive glue). The second thermosiphon device 18 corresponds to the first right side flow channel 124 and the second right side flow channel 144 and is thermally coupled between the first liquid cooling plate 12 and the second liquid cooling plate 14 (for example, the second thermosiphon device 18 directly contacts the surface 12*a* of the first liquid cooling plate 12 and the surface 14*a* of the second liquid cooling plate 14, and the contact surfaces thereof can be coated with conductive thermal glue). Therein, the first thermosiphon device 16 includes a condenser 162, an evaporator 164, two transfer tubes 166 connecting the condenser 162 and the evaporator 164, and the working fluid flowing in the above components. The second thermosiphon device 18 includes a condenser 182, an evaporator 184, two transfer tubes 186 connecting the condenser 182 and the evaporator 184, and the working fluid flowing in the above components. The first thermosiphon device 16 is thermally coupled to the first liquid cooling plate 12 and the second liquid cooling plate 14 through the condenser 162. The first thermosiphon device 16 is thermally coupled to a heat source (e.g., a processor) through the evaporator 164. Thereby, the first thermosiphon device 16 can transfer the heat generated by the heat source to the first liquid cooling plate 12 and the second liquid cooling plate 14, and then the heat can be dissipated through the external heat exchanger. The second thermosiphon device 18 is thermally coupled to the first liquid cooling plate 12 and the second liquid cooling plate 14 through the condenser 182. The second thermosiphon device 18 is thermally coupled to a heat source (e.g., a processor) through the evaporator 184. Thereby, the second thermosiphon device 18 can transfer the heat generated by the heat source to the first liquid cooling plate 12 and the second liquid cooling plate 14, and then the heat can be dissipated through the external heat exchanger.

Furthermore, through the first parallel flow channel of the first liquid cooling plate 12 and the second parallel flow channel of the second liquid cooling plate 14, and the series connection of the first parallel flow channel and the second parallel flow channel, the first liquid cooling plate 12 and the second liquid cooling plate 14 provide similar cooling conditions for the two heat sources (e.g., processors) that are thermally coupled to the first thermosiphon device 16 and the second thermosiphon device 18 respectively, which can effectively reduce the temperature difference between the two heat sources.

Furthermore, through the series configuration of the first parallel flow channel of the first liquid cooling plate 12 and the second parallel flow channel of the second liquid cooling plate 14, the number of connections between the liquid cooling plates and external piping (e.g., the manifold on the server cabinet, not shown in the figures) is relatively reduced, which can further reduces the obstruction of the external piping to the cooling airflow within the equipment chassis, thereby reducing fan power consumption.

Figure 7:
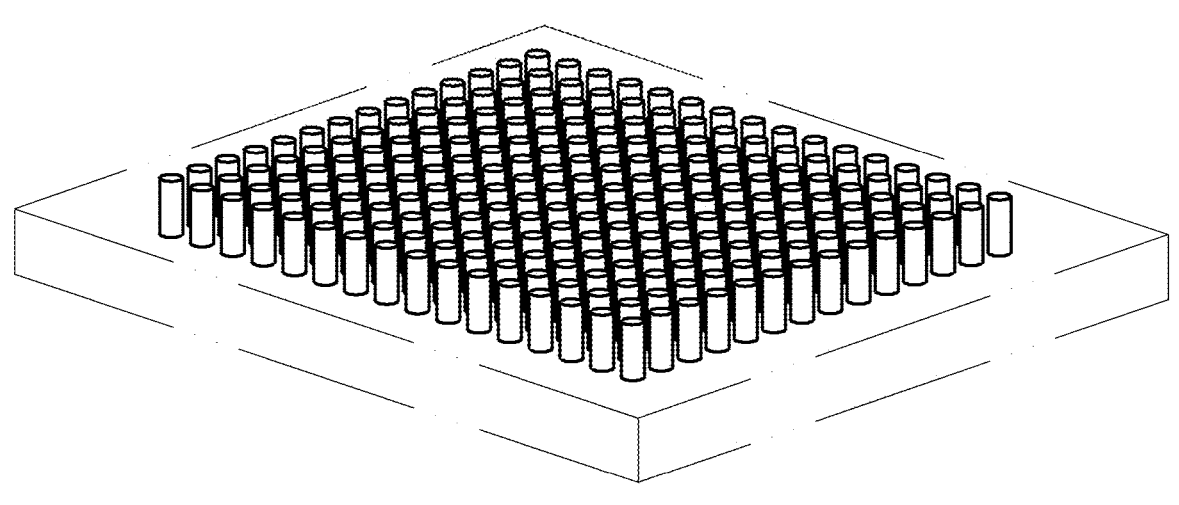
FIG. 7 is a schematic diagram illustrating a plurality of columnar fins.
Figure 8:
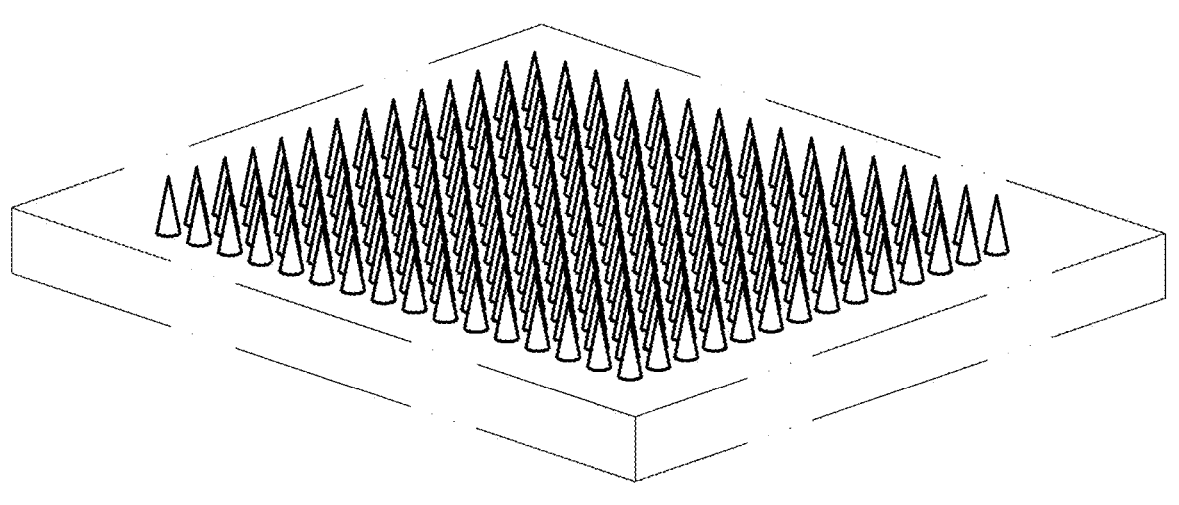
FIG. 8 is a schematic diagram illustrating a plurality of conical fins.
Figure 9:
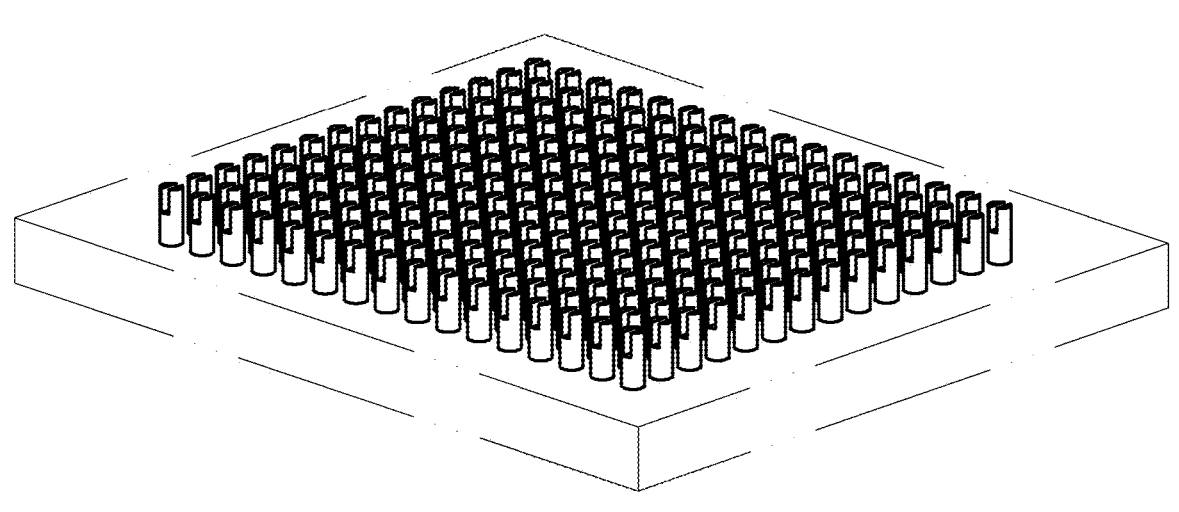
FIG. 9 is a schematic diagram illustrating a plurality of columnar fins with straight cuts.
Figure 10:
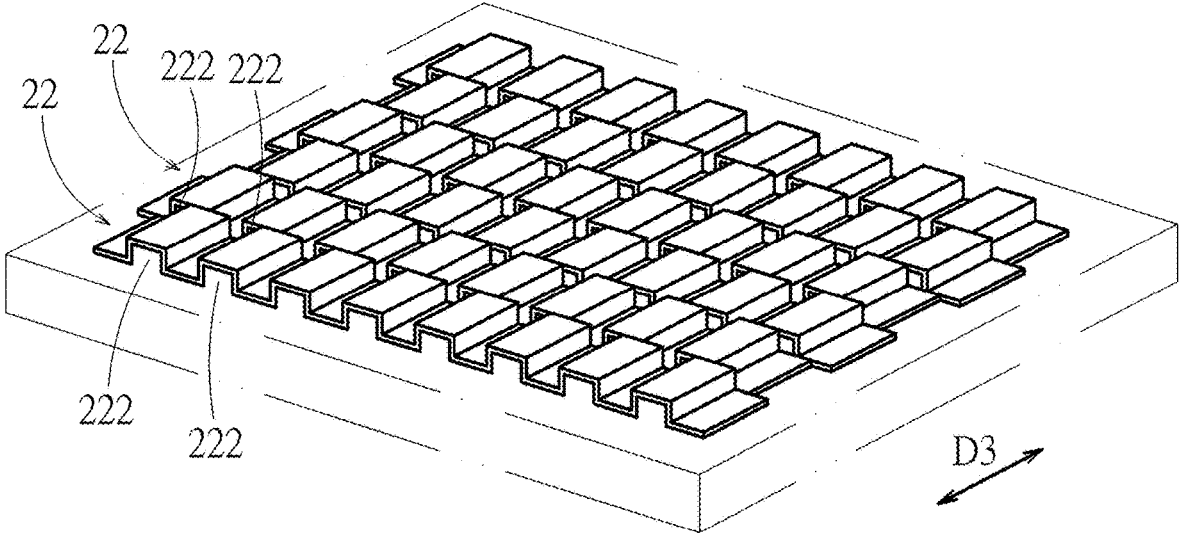
FIG. 10 is a schematic diagram of a structure of fins formed by a plurality of sheets.

Furthermore, as shown by FIG. 4 and FIG. 5, the fins in the first liquid cooling plate 12 and the second liquid cooling plate 14 are in principle thin plates and extend parallel to the flow direction of the working fluid. In practice, the fins in the first liquid cooling plate 12 and the second liquid cooling plate 14 can also be implemented by other types of fins; for example, the fin is a column (as shown by FIG. 7), a cone (as shown by FIG. 8), or a column with a straight cut (As shown by FIG. 9). Furthermore, in practice, the above fin structure (i.e., a structural configuration formed by the plurality of fins) can also be replaced by other structures that can also increase the contact area with the working fluid. For example, as shown by FIG. 10, a plurality of sheets 22 are used to form a structure that can increase the contact area with the working fluid (logically, it can also be regarded as a fin structure), thereby replacing the above fins disposed in the first liquid cooling plate 12 and the second liquid cooling plate 14. Therein, the sheet 22 is bent to form a plurality of channels 222 which extend parallel to a third direction D3 (indicated by a double-headed arrow in the figure, e.g., parallel to the flow direction of the first left side flow channel 122). The plurality of sheets 22 are arranged in the third direction D3. The channels 222 of the two sheets 22 that are adjacent disposed are misaligned.

In addition, the cooling system 1 can be used in servers, which can be used for artificial intelligence (AI) computing, edge computing, and can also be used as 5G servers, cloud servers or vehicle-to-everything servers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cooling system, comprising:

a first liquid cooling plate, the first liquid cooling plate having a first left side flow channel, a first right side flow channel, a first inlet, and a first outlet, the first left side flow channel being connected to the first inlet and the first outlet, the first right side flow channel being connected to the first inlet and the first outlet;

a second liquid cooling plate, the second liquid cooling plate having a second left side flow channel, a second right side flow channel, a second inlet, and a second outlet, the second left side flow channel being connected to the second inlet and the second outlet, the second right side flow channel being connected to the second inlet and the second outlet;

a communication structure, the communication structure being disposed between the first liquid cooling plate and the second liquid cooling plate and connecting the first outlet and the second inlet;

a first thermosiphon device, the first thermosiphon device being located between the first left side flow channel and the second left side flow channel and being thermally coupled to the first liquid cooling plate and the second liquid cooling plate; and a second thermosiphon device, the second thermosiphon device being located between the first right side flow channel and the second right side flow channel and being thermally coupled to the first liquid cooling plate and the second liquid cooling plate, the first thermosiphon device and the second thermosiphon device being located on opposite sides of the communication structure.

2. The cooling system according to claim 1, wherein the communication structure is located inside the first liquid cooling plate and the second liquid cooling plate.

3. The cooling system according to claim 1, wherein the communication structure has a connecting flow channel, and the connecting flow channel extends parallel to the first liquid cooling plate and the second liquid cooling plate.

4. The cooling system according to claim 1, wherein the second liquid cooling plate is located above the first liquid cooling plate in a direction of gravity.

5. The cooling system according to claim 1, wherein the first left side flow channel and the first right side flow channel are both a U-shaped flow channel.

6. The cooling system according to claim 5, wherein the first left side flow channel comprises two sections in sequence, and a flow resistance of the first left side flow channel between the two sections is less than a flow resistance of either of the two sections.

7. The cooling system according to claim 6, wherein the first left side flow channel comprises a cavity section between the two sections, there are fins in the two sections, and there is no fin in the cavity section.

8. The cooling system according to claim 1, wherein the first left side flow channel and the first right side flow channel are symmetrical in structure.

9. The cooling system according to claim 1, wherein two sheets are disposed in the first left side flow channel, each sheet is bent to form a plurality of channels which extends parallel to a flow direction of the first left side flow channel, the two sheets are adjacently arranged in the flow direction, and the channels of the two sheet are misaligned.

10. The cooling system according to claim 1, wherein the first thermosiphon device comprises a condenser, an evaporator, and two transfer tubes, each transfer tube is connected to the condenser and the evaporator, and the first thermosiphon device is thermally coupled to the first liquid cooling plate and the second liquid cooling plate through the condenser.

* * * * *